United States Patent
Lee

(10) Patent No.: US 8,037,372 B2
(45) Date of Patent: Oct. 11, 2011

(54) APPARATUS AND METHOD FOR TESTING SETUP/HOLD TIME

(75) Inventor: Jeong-Hun Lee, Ichon (KR)

(73) Assignee: Hynix Semiconductor Inc. (KR)

( * ) Notice: Subject to any disclaimer, the term of this patent is extended or adjusted under 35 U.S.C. 154(b) by 246 days.

(21) Appl. No.: 12/346,663

(22) Filed: Dec. 30, 2008

(65) Prior Publication Data

US 2010/0077268 A1 Mar. 25, 2010

(30) Foreign Application Priority Data

Sep. 24, 2008 (KR) .................. 10-2008-0093532

(51) Int. Cl.
*G11B 20/20* (2006.01)
*G11C 29/00* (2006.01)
*G01R 31/28* (2006.01)
*H03L 7/00* (2006.01)
*H03L 7/06* (2006.01)
*H03K 5/12* (2006.01)
*H03H 11/26* (2006.01)

(52) U.S. Cl. ........ 714/700; 714/718; 714/731; 327/141; 327/149; 327/170; 327/269; 327/270

(58) Field of Classification Search .................. 714/700, 714/718, 731; 327/141, 149, 170, 269, 270
See application file for complete search history.

(56) References Cited

U.S. PATENT DOCUMENTS

| | | | | | |
|---|---|---|---|---|---|
| 6,041,419 | A | * | 3/2000 | Huang et al. .................. | 713/401 |
| 6,275,428 | B1 | * | 8/2001 | Fukuda et al. ................ | 365/201 |
| 6,693,436 | B1 | * | 2/2004 | Nelson .......................... | 324/537 |
| 6,775,637 | B2 | * | 8/2004 | Garcia .......................... | 702/117 |
| 6,812,727 | B2 | * | 11/2004 | Kobayashi .................... | 324/765 |
| 6,876,186 | B1 | * | 4/2005 | Gupta .......................... | 324/76.54 |
| 6,998,892 | B1 | * | 2/2006 | Nguyen et al. ................ | 327/161 |
| 7,069,458 | B1 | * | 6/2006 | Sardi et al. .................... | 713/401 |
| 7,268,602 | B2 | * | 9/2007 | Nguyen et al. ................ | 327/158 |
| 7,385,861 | B1 | * | 6/2008 | Zhu .............................. | 365/194 |
| 7,408,371 | B2 | | 8/2008 | Kim et al. | |
| 7,593,273 | B2 | * | 9/2009 | Chu et al. ...................... | 365/194 |
| 2005/0094448 | A1 | | 5/2005 | Lee et al. | |
| 2006/0282719 | A1 | * | 12/2006 | Damodaran .................. | 714/718 |
| 2009/0296503 | A1 | * | 12/2009 | Chu et al. ...................... | 365/193 |

FOREIGN PATENT DOCUMENTS

| KR | 1020060008678 | 1/2006 |
|---|---|---|
| KR | 100723768 | 5/2007 |

* cited by examiner

*Primary Examiner* — John J Tabone, Jr.
(74) *Attorney, Agent, or Firm* — Baker & McKenzie LLP

(57) ABSTRACT

An apparatus for testing setup/hold time includes a plurality of data input units, each configured to calibrate setup/hold time of input data in response to selection signals and setup/hold calibration signals, and an off-chip driver calibration unit configured to generate the selection signals and the setup/hold calibration signals by using the input data input of one of the plurality of data input units.

22 Claims, 8 Drawing Sheets

APPARATUS AND METHOD FOR TESTING SETUP/HOLD TIME

CROSS-REFERENCES TO RELATED APPLICATION

The present application claims priority under 35 U.S.C. §119(a) to Korean application number 10-2008-0093532, filed on Sep. 24, 2008, in the Korean Intellectual Property Office, which is incorporated herein by reference in its entirety as if set forth in full.

BACKGROUND

1. Technical Field

The embodiments described herein relate to a test apparatus, and more particularly, to an apparatus and a method for testing setup/hold time.

2. Related Art

One important parameters during writing operations of a semiconductor integrated circuit, and more particularly of a semiconductor memory device, is setup/hold time. Here, only when the setup/hold time have proper margins can data to be written become centered according to a data strobe signal 'DQSB'. As a result, the data can be accurately written in a memory region of the semiconductor integrated circuit.

FIG. 1 is a schematic block diagram of a conventional data input apparatus of a semiconductor integrated circuit. In FIG. 1, a data input apparatus 1 includes a plurality of data input units DIP_DQ0 to DIP_DQ7 and an off-chip driver calibration unit 10. All of the plurality of data input units DIP_DQ0 to DIP_DQ7 are structured to be the same.

Each of the plurality of data input units DIP_DQ0 to DIP_DQ7 are structured to receive an enable signal 'ENDINB', data signals 'DATA<0:7>', and a data strobe signal 'DQSB' as inputs. Here, the plurality of data input units DIP_DQ0 to DIP_DQ7 are connected in a one-to-one correspondence with data pins DQ0 to DQ7 (not shown).

The off chip driver calibration unit 10 is structured to calibrate a level of output data of an off-chip driver (not shown). Here, the off-chip driver calibration unit 10 receives data previously obtained, i.e., pre-fetched, in one of the plurality of data input units DIP_DQ0 to DIP_DQ7, and receives a data clock signal 'DCLK' as inputs to output the off chip driver calibration signals 'PU_INCD', 'PU_DECD', 'PD_INCD', and 'PD_DECD'. The off chip driver calibration signals 'PU_INCD', 'PU_DECD', 'PD_INCD', and 'PD_DECD' are used to calibrate the level of output data of the off-chip driver (not shown).

FIG. 2 is a schematic block diagram of a conventional data input unit DIP_DQ6 used in the apparatus of FIG. In FIG. 2, the data input unit DIP_DQ6 includes an input buffer 21, a pre-fetch circuit unit 22, and a write driver 23. The off-chip driver calibration unit 10 receives output data of the pre-fetch circuit unit 22 as input.

The input buffer 21 buffers and outputs data signal 'DATA<6>' when an enable signal 'ENDINB' is enabled. The pre-fetch circuit unit 22 will pre-fetch output data, i.e., pre-fetch 4 bits, of the input buffer 21 to center the output data according to the data strobe signal 'DQSB', and then output the output data. The write driver 23 drives output data of the pre-fetch circuit unit 22 to write the output data in a memory region of the semiconductor integrated circuit.

FIG. 3 is a schematic block diagram of a conventional off-chip driver calibration unit used in the apparatus of FIG. 1. In FIG. 3, the off-chip driver calibration unit 10 includes a latch circuit unit 11 and a decoder 12.

The latch circuit unit 11 latches data signals 'ALGNR0B', 'ALGNF0B', 'ALGNR1B', and 'ALGNF1B' output from the pre-fetch circuit unit 22 according to the data clock signal 'DCLK' to output latched data signals 'DIN0B', 'DIN1B', 'DIN2B', and 'DIN3B'. The decoder 12 decodes the latched data signals 'DIN0B', 'DIN1B', 'DIN2B', and 'DIN3B' to output the off-chip driver calibration signals 'PU_INCD', 'PU_DECD', 'PD_INCD', and 'PD_DECD'.

Considering circuit arrangements inside a chip of a semiconductor integrated circuit, simulation operations, i.e., setup/hold simulations, for setting a setup/hold margin in a data writing operation to a proper level is performed by a modeling operation in consideration of signal loads.

However, the data input apparatus 1 (in FIG. 1) is problematic. For example, the circuit configurations of the data input apparatus 1 (in FIG. 1) are not capable of performing a test for judging appropriateness of setup/hold time selectively with respect to a plurality of data pins. Although data pins of a semiconductor integrated circuit are in the one-to-one correspondence with the plurality of data input units DIP_DQ0 to DIP_DQ7, the plurality of data input units DIP_DQ0 to DIP_DQ7 have different data output characteristics from each other due to differences during fabrication processes and operation circumstances.

In addition, since the data input apparatus 1 (in FIG. 1) is not capable of testing respective data pins separately, one of the margins of setup/hold time in the designed circuit according to the setup/hold simulation will not be sufficient. Accordingly, since data to be written in the memory region are not centered when margins of setup/hold time are insufficient, a revision operation is required, thereby causing a loss production time and increasing production costs. Moreover, when performing the revision operation, since another simulation for data alignment should be performed, as well as the setup/hold simulation, additional time and cost are needed due to additional simulations.

SUMMARY

An apparatus and a method for testing setup/hold time capable of performing setup/hold time testing operations are described herein.

In one aspect, an apparatus for testing setup/hold time includes a plurality of data input units, each configured to calibrate setup/hold time of input data in response to selection signals and setup/hold calibration signals, and an off-chip driver calibration unit configured to generate the selection signals and the setup/hold calibration signals by using the input data input of one of the plurality of data input units.

In another aspect, an apparatus for testing setup/hold time includes a plurality of data input units configured to calibrate setup/hold time of data input to the plurality of data input units in response to a setup/hold calibration signals when selection signals input to the plurality of data input units are enabled, and an off-chip driver calibration unit configured to generate the off-chip driver calibration signals for calibrating a level of output data of an off-chip driver by using the data input to one of the plurality of data input units, when the test mode signal is in a disabled state, and to generate the selection signals and the setup/hold calibration signals by using the data input to one of the plurality of data input units, when the test mode signal is in an enabled state.

In another aspect, a method for testing setup/hold time includes calibrating a level of output data of an off-chip driver according to first input data when a test mode is in a disabled state, and calibrating setup/hold time of a selected data input unit among a plurality of data input units according to second input data when a test mode is in an enabled state.

In another aspect, a method for testing setup/hold time includes decoding data input to input terminals of an off-chip driver calibration unit through a first signal path to output a first decoded signal when a test mode signal is in a disabled state, and calibrating a level of output data of an off-chip driver according to the first decoded signal, wherein the off-chip driver calibration unit decodes data input to the input terminal through a second signal path to output a second decoded signal when the test mode signal is in an enabled state, and calibrates setup/hold time of a data input unit selected among the plurality of data input units according to the second decoded signal.

In another aspect, an apparatus for testing setup/hold time includes an input buffer configured to receive input data, a setup/hold calibration unit configured to calibrate setup/hold time of the input data by delaying an output signal of the input buffer by as much as a delay time corresponding to the setup/hold calibration signals enabled according to the selection signals, a pre-fetch circuit unit configured to pre-fetch an output signal of the setup/hold calibration unit to output pre-fetched data, a first latch circuit unit configured to latch the pre-fetched data to output latched data, and a plurality of decoders, each configured to decode the latched data to output one of off-chip driver calibration signals, the selection signals, and the setup/hold calibration signals.

In another aspect, a semiconductor memory apparatus includes a plurality of data input units calibrating setup/hold time of input data in response to selection signals and setup/hold calibration signals, and an off-chip driver calibration unit configured to generate the selection signals and the setup/hold calibration signals by using the input data input of one of the plurality of data input units, wherein memory data is written into memory regions according to the setup/hold time of the input data.

These and other features, aspects, and embodiments are described below in the section "Detailed Description."

BRIEF DESCRIPTION OF THE DRAWINGS

Features, aspects, and embodiments are described in conjunction with the attached drawings, in which.

DETAILED DESCRIPTION

Figure 1:
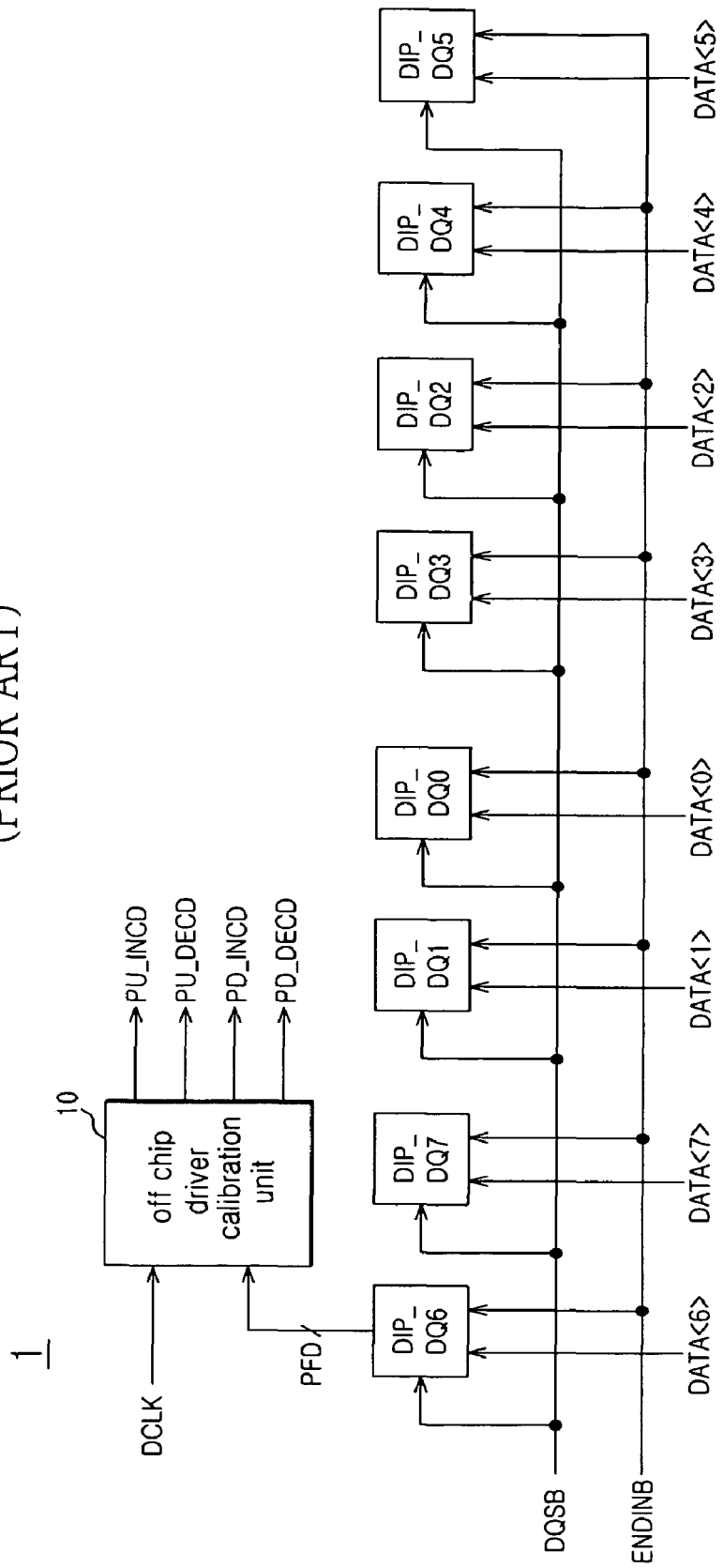
FIG. 1 is a schematic block diagram of a conventional data input apparatus of a semiconductor integrated circuit.
Figure 2:
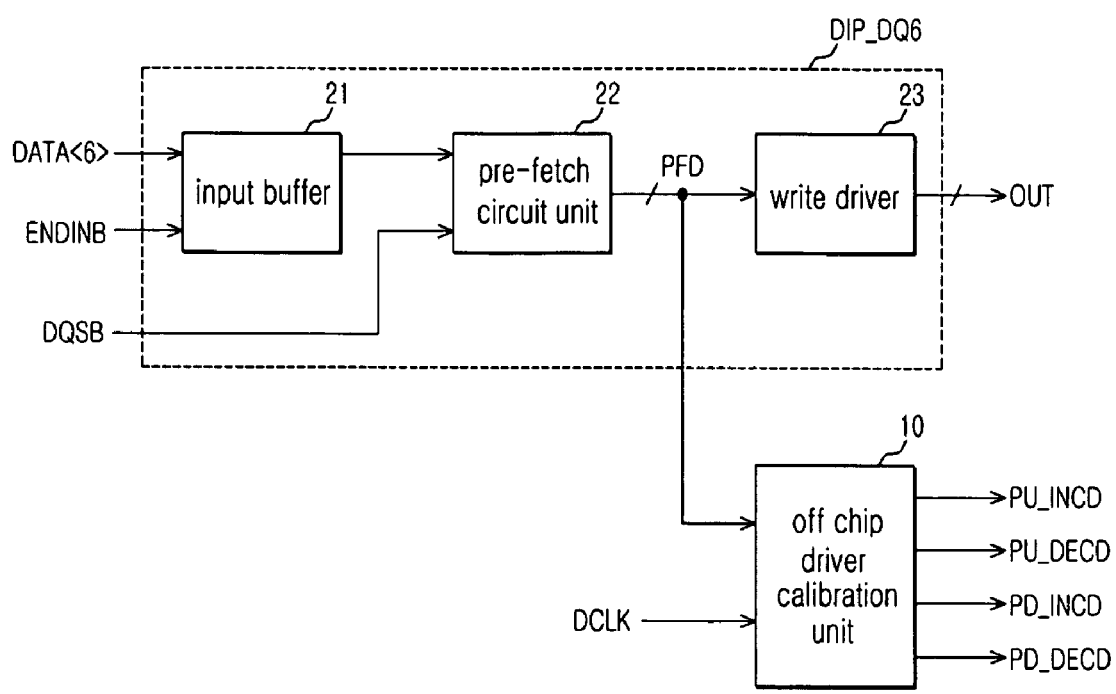
FIG. 2 is a schematic block diagram of a conventional data input unit DIP_DQ6 used in the apparatus of FIG. 1.
Figure 3:
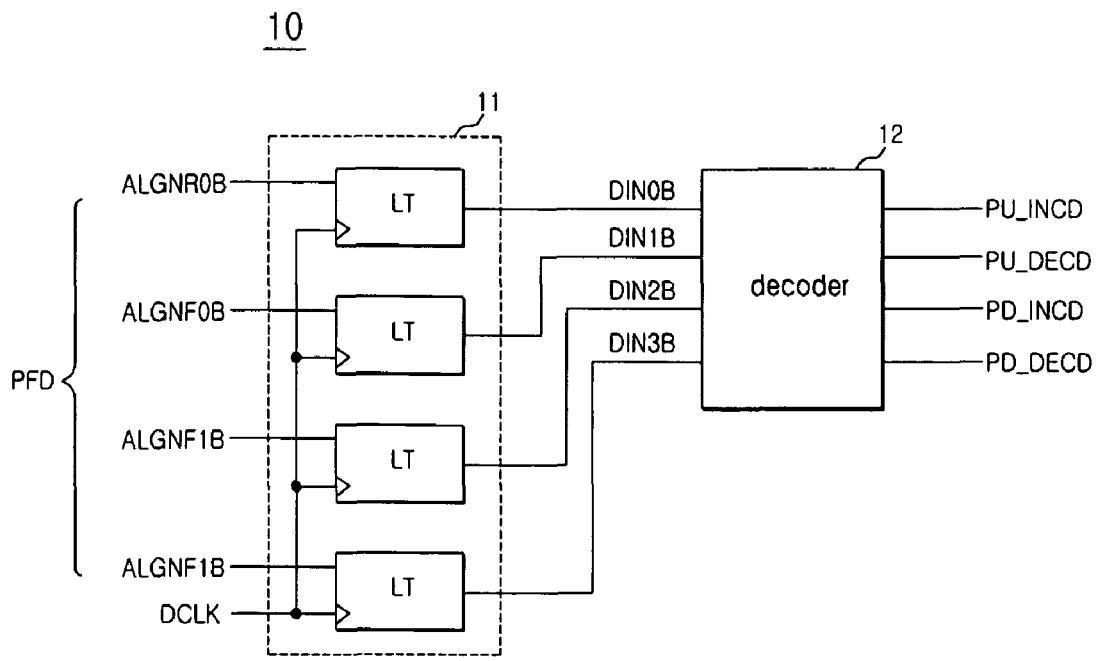
FIG. 3 is a schematic block diagram of a conventional off-chip driver calibration unit used in the apparatus of FIG. 1.
Figure 4:
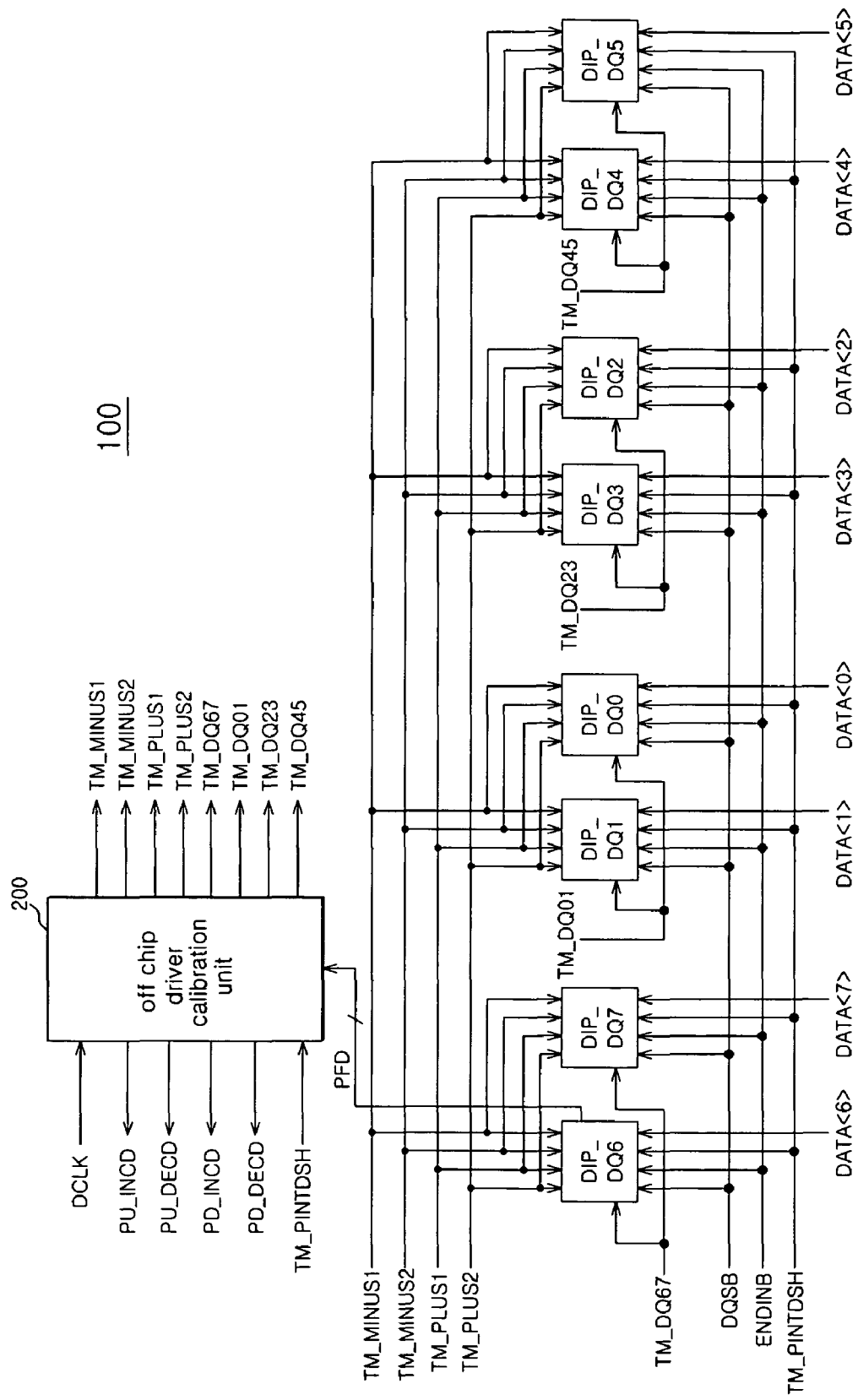
FIG. 4 is a schematic block diagram of an exemplary apparatus for testing setup/hold time according to one embodiment.

FIG. 4 is a schematic block diagram of an exemplary apparatus 100 for testing setup/hold time according to one embodiment.

In FIG. 4, the apparatus 100 for testing setup/hold time can be configured to include a plurality of data input units DIP_DQ0 to DIP_DQ7 and an off-chip driver calibration unit 200. Here, the apparatus 100 can selectively test setup/hold time of the plurality of data input units DIP_DQ0 to DIP_DQ7 by using the off-chip driver calibration unit 200 to calibrate a level of output data of an off-chip driver.

In FIG. 4, the plurality of data input units DIP_DQ0 to DIP_DQ7 receive setup/hold calibration signals 'TM_MINUS1', 'TM_MINUS2', 'TM_PLUS1', and 'TM_PLUS2', selection signals 'TM_DQ67', 'TM_DQ01', 'TM_DQ23', and 'TM_DQ45', a data strobe signal 'DQSB', an enable signal 'ENDINB', and a test mode signal 'TM_PINTDSH' as inputs. The plurality of data input units DIP_DQ0 to DIP_DQ7 can be configured to calibrate and output setup/hold time of data signal 'DATA<0:7>' that can be input in response to the setup/hold calibration signals 'TM_MINUS1', 'TM_MINUS2', 'TM_PLUS1', and 'TM_PLUS2', when the selection signals 'TM_DQ67', 'TM_DQ01', 'TM_DQ23', and 'TM_DQ45' are enabled.

The plurality of data input units DIP_DQ0 to DIP_DQ7 can be configured in a one-to-one correspondence to data pins DQ0 to DQ7 (not shown). The plurality of data input units DIP_DQ0 to DIP_DQ7 can be configured such that adjacent data input units having substantially similar characteristics in layout, i.e., DIP_DQ6 and DIP_DQ7, DIP_DQ0 and DIP_DQ1, DIP_DQ2 and DIP_DQ3, and DIP_DQ4 and DIP_DQ5, can commonly receive the selection signals 'TM_DQ67', 'TM_DQ01', 'TM_DQ23', and 'TM_DQ45', respectively, to perform operational associations. For example, each of the plurality of data input units DIP_DQ0 to DIP_DQ7 can be configured to be substantially the same.

In FIG. 4, the off-chip driver calibration unit 200 can receive pre-fetched data signal 'PFD' that can be pre-fetched in one of the plurality of data input units DIP_DQ0 to DIP_DQ7. For example, the off-chip calibration unit 200 can receive the pre-fetched data signal 'PDF' from the data input unit DIP_DQ6, the test mode signal 'TM_PINTDSH', and a data clock signal 'DCLK' as inputs, and can output off-chip driver calibration signals 'PU_INCD', 'PU_DECD', 'PD_INCD', and 'PD_DECD' for calibrating a level of output data of an off-chip driver, the selection signals 'TM_DQ67', 'TM_DQ01', 'TM_DQ23', and 'TM_DQ45', and the setup/hold calibration signals 'TM_MINUS1', 'TM_MINUS2', 'TM_PLUS1', and 'TM_PLUS2'.

The off-chip driver calibration unit 200 can be configured so that it generates the off-chip driver calibration signals 'PU_INCD', 'PU_DECD', 'PD_INCD', and 'PD_DECD' by using the pre-fetched data signal 'PFD', when the test mode signal 'TM_PINTDSH' is in a disabled state. In addition, the off-chip driver calibration unit 200 can generate the selection signals 'TM_DQ67', 'TM_DQ01', 'TM_DQ23', and 'TM_DQ45', and the setup/hold calibration signals 'TM_MINUS1', 'TM_MINUS2', 'TM_PLUS1', and 'TM_PLUS2' by using the pre-fetched data signal 'PFD', when the test mode signal 'TM_PINTDSH' is in an enabled state.

Figure 5:
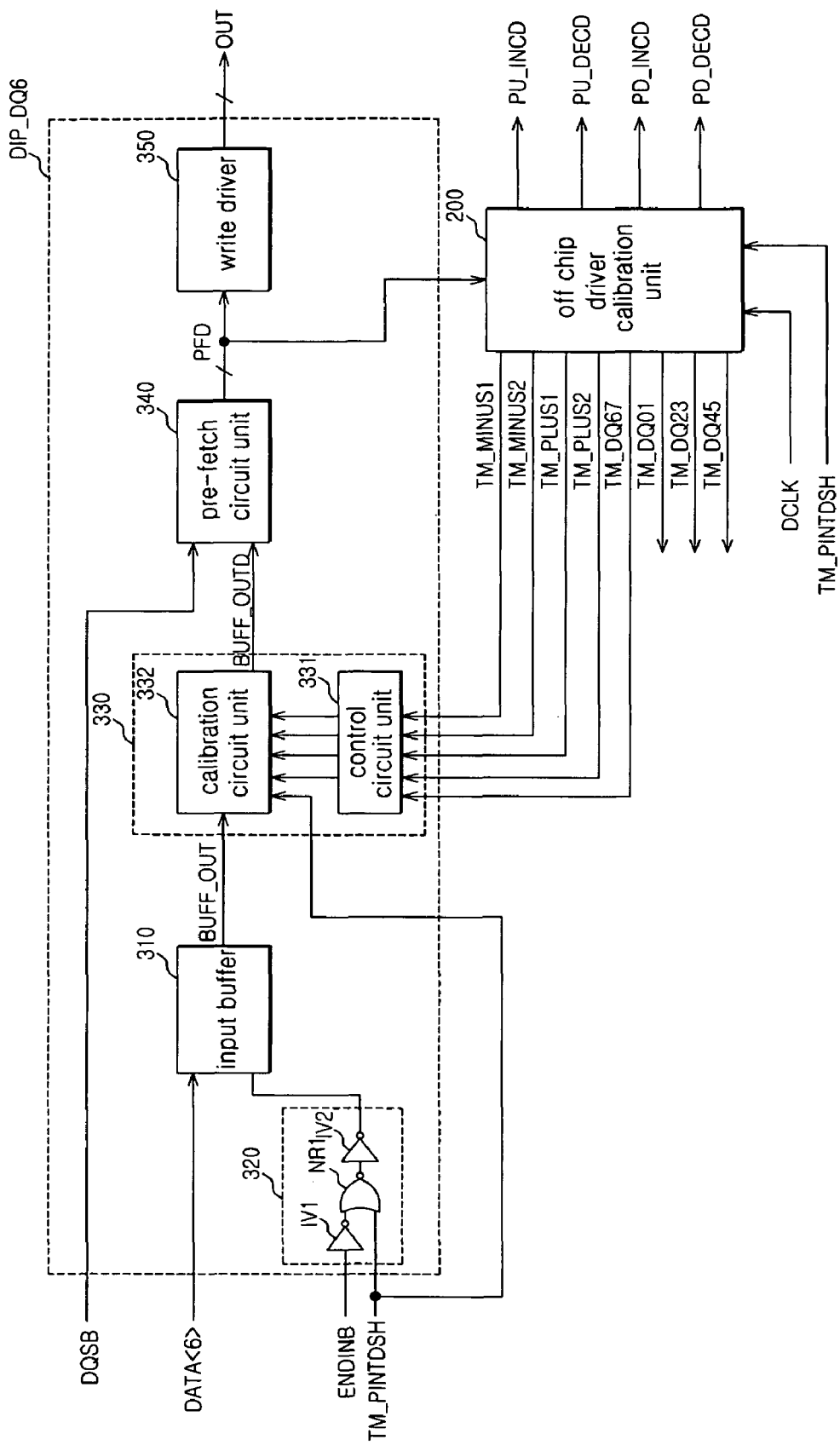
FIG. 5 is a schematic block diagram of an exemplary data input unit DIP_DQ6 capable of being implemented in the apparatus of FIG. 4 according to one embodiment.

FIG. 5 is a schematic block diagram of an exemplary data input unit DIP_DQ6 capable of being implemented in the apparatus of FIG. 4 according to one embodiment. In FIG. 5, the data input unit DIP_DQ6 can be configured to include an input buffer 310, a data input control unit 320, a setup/hold calibration unit 330, a pre-fetch circuit unit 340, and a write driver 350.

The input buffer 310 can receive a data signal 'DATA<6>' as input when an output signal of the data input control unit 320 is at an enabled level, i.e., a logical high level.

The data input control unit 320 can output a high-level signal to the input buffer 310 when either the enable signal 'ENDINB' or the test mode signal 'TM_PINTDSH' is enabled. For example, the data input control unit 320 can include first and second inverters IV1 and IV2, and a NOR gate NR1.

In addition, the setup/hold calibration unit 330 can include a control circuit unit 331 and a calibration circuit unit 332.

Figure 6:
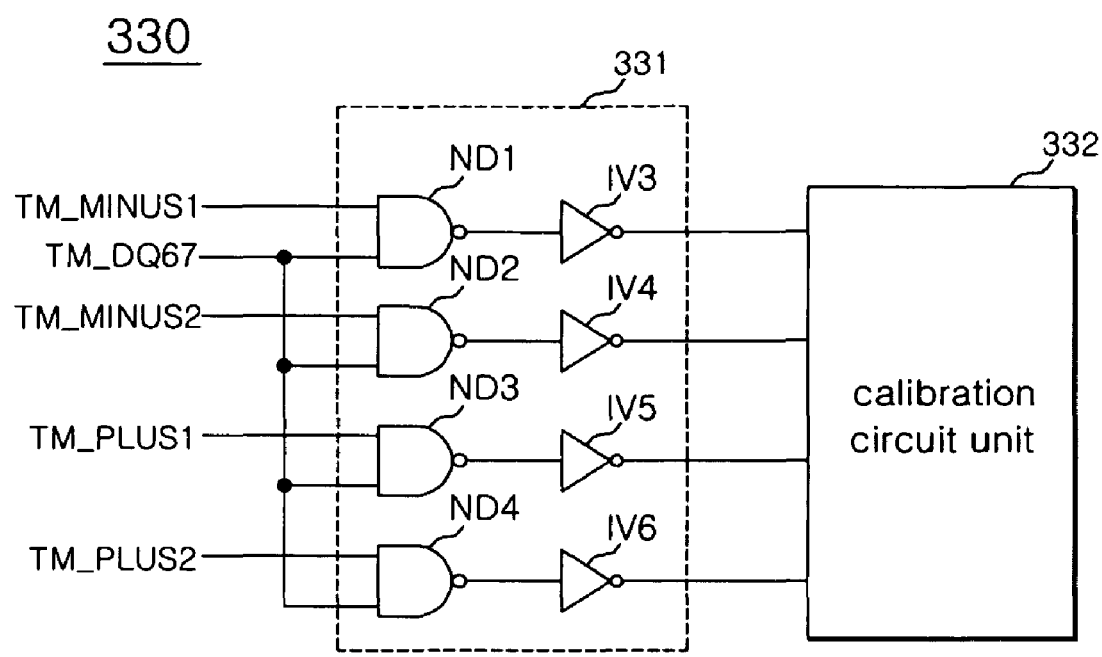
FIG. 6 is a schematic circuit diagram of an exemplary control circuit unit capable of being implemented in the unit of FIG. 5 according to one embodiment.

FIG. 6 is a schematic circuit diagram of an exemplary control circuit unit capable of being implemented in the unit of FIG. 5 according to one embodiment. In FIG. 6, the control circuit unit 331 can include a plurality of NAND gates ND1 to ND4 and a plurality of inverters IV3 to IV6. The control circuit unit 331 can perform logical AND operations on a selection signal 'TM_DQ67' and the setup/hold calibration signals 'TM_MINUS1', 'TM_MINUS2', 'TM_PLUS1', and 'TM_PLUS2', and can then output operational results to the calibration circuit unit 332, respectively. For example, the control circuit unit 331 can output the setup/hold calibration signals 'TM_MINUS1', 'TM_MINUS2', 'TM_PLUS1', and 'TM_PLUS2', each having their own logical values when the selection signal 'TM_DQ67' is enabled to a logical high level. In addition, the control circuit unit 331 can output the setup/hold calibration signals 'TM_MINUS1', 'TM_MINUS2', 'TM_PLUS1', and 'TM_PLUS2', each having logical low levels when the selection signal 'TM_DQ67' is disabled to a logical low level. When the test mode signal 'TM_PINTDSH' is in an enabled state, the calibration circuit unit 332 can delay an output signal 'BUFF_OUT' of the input buffer 310 by a delay time, which can be calibrated according to the setup/hold calibration signals 'TM_MINUS1', 'TM_MINUS2', 'TM_PLUS1', and 'TM_PLUS2' output through the control circuit unit 331, and can then output an output signal 'BUFF_OUTD'.

In FIG. 5, the pre-fetch circuit unit 340 can pre-fetch, for example, as many as 4 bits, the output signal 'BUFF_OUTD' of the setup/hold calibration unit 330 by using the data strobe signal 'DQSB', and can then output the pre-fetched data signal 'PFD'.

In addition, the write driver 350 (in FIG. 5) can drive the pre-fetched data signal 'PFD', and can then write the pre-fetched data in a memory region of a semiconductor integrated circuit.

Figure 7:
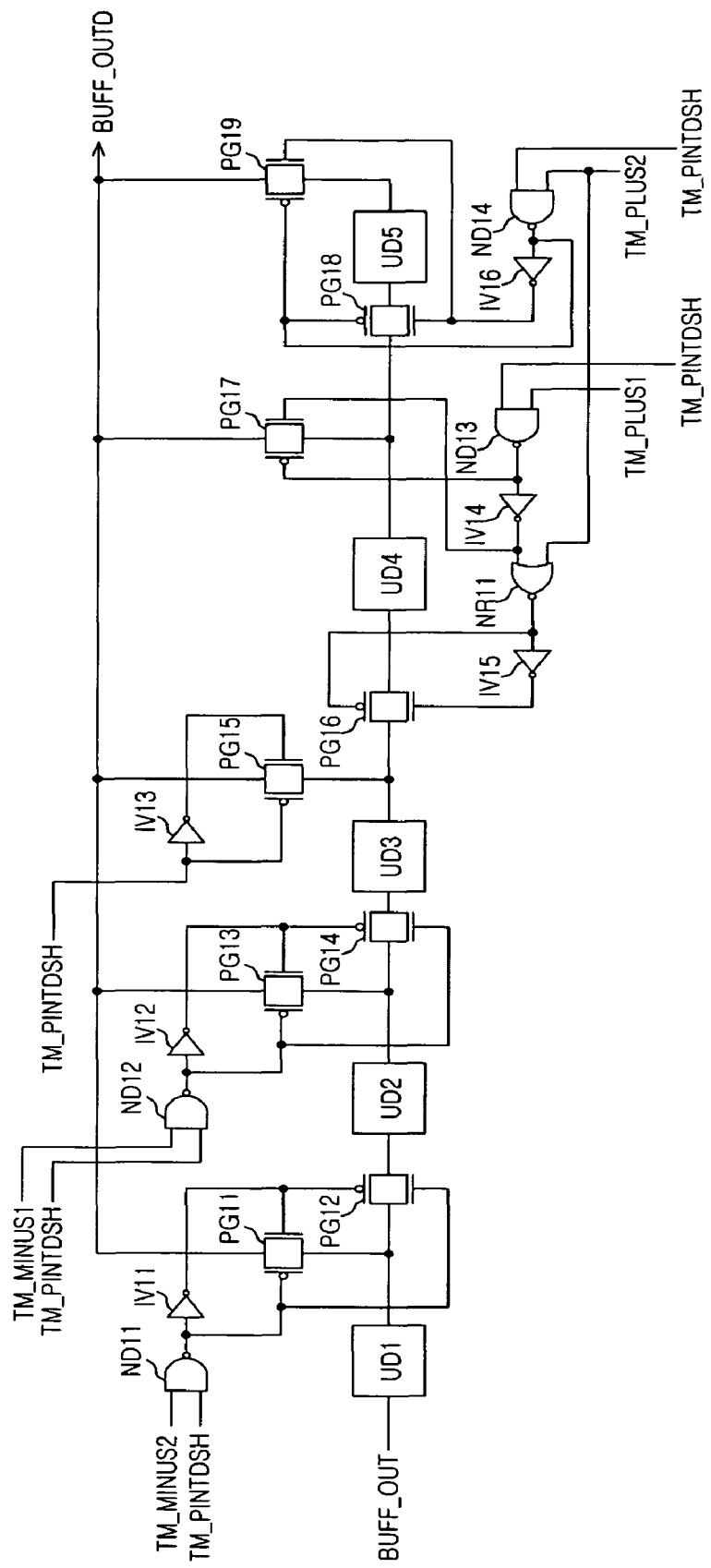
FIG. 7 is a schematic circuit diagram of an exemplary calibration circuit unit capable of being implemented in the unit of FIG. 5 according to one embodiment.

FIG. 7 is a schematic circuit diagram of an exemplary calibration circuit unit capable of being implemented in the unit of FIG. 5 according to one embodiment. In FIG. 7, the calibration circuit unit 332 can be configured to include a plurality of unit delays UD1 to UD5, a plurality of pass gates PG11 to PG19, a plurality of NAND gates ND11 to ND 14, a NOR gate NR11, and a plurality of inverters IV11 to IV16.

The calibration circuit unit 332 can be configured such that, among the plurality of unit delays UD1 to UD5, the number of unit delays through which the output signal 'BUFF_OUT' of the input buffer 310 passes can be changed according to the setup/hold calibration signals 'TM_MINUS1', 'TM_MINUS2', 'TM_PLUS1', and 'TM_PLUS2'. For example, the number of unit delays through which an input signal passes can be 3, i.e., unit delays UD1 to UD3, when the test mode signal 'TM_PINTDSH' is in a disabled state, and unit delays UD1 to UD3 can be referred to as initial setting unit delays. Accordingly, the setup/hold calibration signals 'TM_MINUS1', 'TM_MINUS2', 'TM_PLUS1', and 'TM_PLUS2' can be respectively specified as 1 stage decrement, 2 stage decrements, 1 stage increment, and 2 stage increments with respect to the initial setting unit delays UD1 to UD3.

Accordingly, when a setup/hold calibration signal 'TM_MINUS2' is enabled, among the plurality of unit delays UD1 to UD5, unit delay through which an input signal passes is only a unit delay UD1, i.e., 2 stages less than the initial setting unit delays UD1 to UD3. In a similar manner, when the respective setup/hold calibration signals 'TM_MINUS1', 'TM_PLUS1', and 'TM_PLUS2' are enabled, unit delays through which an input signal passes are 2 unit delays UD1 and UD2, 4 unit delays UD1 to UD4, and 5 unit delays UD1 to UD5, respectively.

Figure 8:
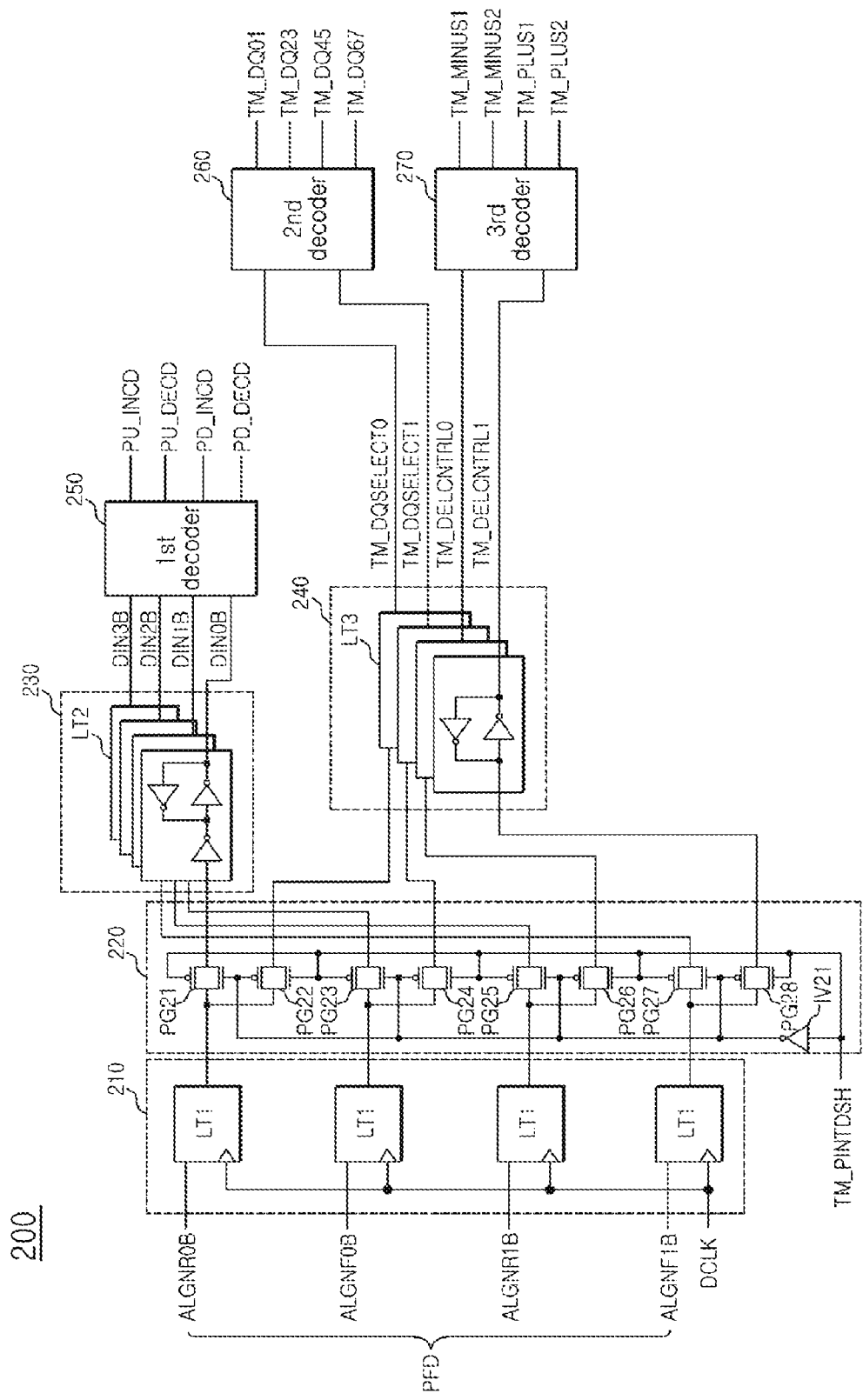
FIG. 8 is a schematic block diagram of an exemplary off-chip driver calibration unit capable of being implemented in the apparatus of FIG. 4 according to one embodiment.

FIG. 8 is a schematic block diagram of an exemplary off-chip driver calibration unit capable of being implemented in the apparatus of FIG. 4 according to one embodiment. In FIG. 8, the off-chip driver calibration unit 200 can be configured to include a first latch circuit unit 210, a switching unit 220, a second latch circuit unit 230, a third latch circuit unit 240, a first decoder 250, a second decoder 260, and a third decoder 270.

The first latch circuit unit 210 can include a plurality of latches LT1 that can latch the pre-fetched data signal 'PFD', which can include one of signals 'ALGNR0B', 'ALGNF0B', 'ALGNR1B', and 'ALGNF1B', according to the data clock signal 'DCLK'.

The switching unit 220 can include a plurality of pass gates PG21 to PG28 and an inverter IV21. When the test mode signal 'TM_PINTDSH' is disabled, a first pass gate group PG21, PG23, PG25, and PG27 can be turned ON and, consequently, the switching unit 220 can transmit output signals of the first latch circuit unit 210 to the second latch circuit unit 230. When the test mode signal 'TM_PINTDSH' is enabled, a second pass gate group PG22, PG24, PG26, and PG28 can be turned ON and, consequently, the switching unit 220 can transmit output signals of the first latch circuit unit 210 to the third latch circuit unit 240.

The second latch circuit unit 230 can latch output signals of the first pass gate group PG21, PG23, PG25, and PG27 by using a plurality of latches LT2 to output the output signals of the first pass gate group PG21, PG23, PG25, and PG27 to the first decoder 250.

The third latch circuit unit 240 can latch output signals of the second pass gate group PG22, PG24, PG26, and PG28 by using a plurality of latches LT3. Here, the third latch circuit unit 240 can latch signals 'TM_DQSELECT0', 'TM_DQSELECT1', 'TM_DELCNTRL0', and 'TM_DELCNTRL1', and output a first portion of the latched signals, i.e., 'TM_DQSELECT0' and 'TM_DQSELECT1', to the second decoder 260, and can output a second remaining portion of the latched signals, i.e., 'TM_DELCNTRL0' and 'TM_DELCNTRL1', to the third decoder 270. The latched signals 'TM_DQSELECT0' and 'TM_DQSELECT1' can be selection information encoded signals having encoded information for selecting a data input unit, among the plurality of data input units DIP_DQ0 to DIP_DQ7, to be tested on setup/hold time. The latched signals 'TM_DELCNTRL0' and 'TM_DELCNTRL1' can be setup/hold calibration amount encoded signals having encoded information for determining a setup/hold calibration amount of the calibration circuit unit 332 (in FIG. 7), i.e., the number of unit delays, through which an input signal passes, among the plurality of unit delays UD1 to UD5.

The first decoder 250 can decode output signals 'DIN0B', 'DIN1B', 'DIN2B', and 'DIN3B' of the second latch circuit unit 230 to output off-chip driver calibration signals 'PU_INCD', 'PU_DECD', 'PD_INCD', and 'PD_DECD'.

The second decoder 260 can decode the selection information encoded signals 'TM_DQSELECT0' and 'TM_DQSELECT1' to output selection signals 'TM_DQ67', 'TM_DQ01', 'TM_DQ23', and 'TM_DQ45'. For example, the second decoder 260 can be configured to enable the selection signals in a sequential order of 'TM_DQ01', 'TM_DQ23', 'TM_DQ45', and 'TM_DQ67' when logical levels of the selection information encoded signals 'TM_DQSELECT0' and 'TM_DQSELECT1' are -00--, --01--, --10--, and -11--, respectively. Here, the selection signals 'TM_DQ67', 'TM_DQ01', 'TM_DQ23', and 'TM_DQ45' can be specified to select and perform setup/hold time testing operations on data input units DIP_DQ6 and DIP_DQ7, data input units DIP_DQ0 and DIP_DQ1, data input units DIP_DQ2 and DIP_DQ3, and data input units DIP_DQ4 and DIP_DQ5, respectively.

The third decoder 270 can decode the setup/hold calibration amount encoded signals 'TM_DELCNTRL0' and 'TM_DELCNTRL1' to output the setup/hold calibration signals 'TM_MINUS1', 'TM_MINUS2', 'TM_PLUS1', and 'TM_PLUS2'. For example, the third decoder 270 can be configured to enable the setup/hold calibration signals in a sequential order of 'TM_MINUS1', 'TM_MINUS2', 'TM_PLUS1', and 'TM_PLUS2' when logical levels of the setup/hold calibration amount encoded signals 'TM_DELCNTRL0' and 'TM_DELCNTRL1' are --00--, --01--, --10--, and -11--, respectively.

Accordingly, in order to prevent that previous values of the off-chip driver calibration signals 'PU_INCD', 'PU_DECD', 'PD_INCD', and 'PD_DECD' from being changed when pre-fetched data signal 'PFD', in which the selection information and delay time calibration information are encoded, are newly input to perform the setup/hold time testing operations, a signal path can be changed by using the switching unit 220. In addition, the previous values of the off-chip driver calibration signals 'PU_INCD', 'PU_DECD', 'PD_INCD', and 'PD_DECD' can be stored by using the second latch circuit unit 230.

An exemplary method for testing setup/hold time will now be described with reference to FIGS. 4-8.

At first, after power-up operations of a semiconductor integrated circuit are sequentially performed, when pre-fetched data signal 'ALGNR0B', 'ALGNF0B', 'ALGNR1B', and 'ALGNF1B', which can be input and pre-fetched in one of the plurality of data input units DIP_DQ0 to DIP_DQ7, i.e., a data input unit DIP_DQ6, according to a command signal of a chip set controlling a semiconductor integrated circuit, pass through a first latch circuit unit 210, a switching unit 220, a second latch circuit unit 230, and a first decoder 250 and are decoded, off-chip driver calibration signals 'PU_INCD', 'PU_DECD', 'PD_INCD', and 'PD_DECD' can be generated. Accordingly, since a test mode signal 'TM_PINTDSH' is in a disabled state, the switching unit 220 can transmit output signals of the first latch circuit unit 210 to the second latch circuit unit 230. Thus, by using the second latch circuit unit 230, the off-chip driver calibration signals 'PU_INCD', 'PU_DECD', 'PD_INCD', and 'PD_DECD' can maintain their previous values as they were generated.

Next, when in a test mode, in order to select data input units DIP_DQ0 and DIP_DQ1 and perform a setup/hold time testing operation that calibrates a setup/hold calibration amount to 2 stage decrements, a logical value of latched signals 'TM_DQSELECT0', 'TM_DQSELECT1', 'TM_DELCNTRL0', and 'TM_DELCNTRL1' can be latched in the third latch circuit unit 240, and should be --0001--. Accordingly, while the test mode signal 'TM_PINTDSH' is in an enabled state, data whose logical value is --0001--, can be sequentially input through the data input unit DIP_DQ6.

Although an enable signal 'ENDINB' is disabled to a logical high level when in a test mode, an input buffer 310 (in FIG. 5) can receive and output the data by using the test mode signal 'TM_PINTDSH' in an enabled state.

Then, the calibration circuit unit 332 (in FIG. 7) can delay an output signal 'BUFF_OUT' of the input buffer 310 by as much as initial setting unit delays UD1 to UD3, and can then outputs the delayed output signal 'BUFF_OUT'. Next, the pre-fetch circuit unit 340 (in FIG. 5) can pre-fetch an output signal 'BUFF_OUTD' of the setup/hold calibration unit 330 to output the pre-fetched data signal 'ALGNR0B', 'ALGNF0B', 'ALGNR1B', and 'ALGNF1B'.

In the off chip driver calibration unit 200 (in FIG. 8), when the pre-fetched data signal 'ALGNR0B', 'ALGNF0B', 'ALGNR1B', and 'ALGNF1B' pass through a first latch circuit unit 210, a switching unit 220, a third latch circuit unit 240, a second decoder 260, and a third decoder 270, and are then decoded, selection signals 'TM_DQ67', 'TM_DQ01', 'TM_DQ23', and 'TM_DQ45' and setup/hold calibration signals 'TM_MINUS1', 'TM_MINUS2', 'TM_PLUS1', and 'TM_PLUS2' can be generated.

Since the logical value of the pre-fetched data signal 'ALGNR0B', 'ALGNF0B', 'ALGNR1B', and 'ALGNF1B' is -0001--, a selection signal 'TM_DQ01' can be enabled among selection signals 'TM_DQ67', 'TM_DQ01', 'TM_DQ23', and 'TM_DQ45', and a setup/hold calibration signal 'TM_MINUS2' can be enabled among setup/hold calibration signals 'TM_MINUS1', 'TM_MINUS2', 'TM_PLUS1', and 'TM_PLUS2'.

According to the enabled selection signal 'TM_DQ01' and the enabled setup/hold calibration signal 'TM_MINUS2', input data can be delayed by as much as a time corresponding to a unit delay UD1 in a setup/hold calibration unit 330 of data input units DIP_DQ0 and DIP_DQ1, and can then be output through a pre-fetch circuit unit 340 and a write driver 350. Accordingly, it is possible to detect whether setup/hold margins of the input data are sufficient by means of the output data.

In a similar manner, it is possible to select some of a plurality of data input units DIP_DQ0 to DIP_DQ7 in turn, and to calibrate setup/hold time for each data input unit, thereby performing setup/hold time testing operations.

While certain embodiments have been described above, it will be understood that the embodiments described are by way of example only. Accordingly, the device and methods described herein should not be limited based on the described embodiments. Rather, the device and methods described herein should only be limited in light of the claims that follow when taken in conjunction with the above description and accompanying drawings.

What is claimed is:
1. An apparatus for testing setup/hold time, comprising:
a plurality of data input units, each configured to be selected in response to respective selection signals, wherein a selected input unit is configured to calibrate setup/hold time of input data in response to setup/hold calibration signals; and
an off-chip driver calibration unit configured to generate the selection signals and the setup/hold calibration signals using the input data in response to a test mode signal.

2. The apparatus for testing setup/hold time of claim 1, wherein each of the plurality of data input units include:
   an input buffer configured to receive the input data;
   a setup/hold calibration unit configured to calibrate setup/hold time of the input data by delaying an output signal of the input buffer by as much as a delay time corresponding to the setup/hold calibration signals enabled according to the selection signals; and
   a pre-fetch circuit unit configured to pre-fetch an output signal of the setup/hold calibration unit to output pre-fetched data.

3. The apparatus for testing setup/hold time of claim 2, wherein the setup/hold calibration unit is configured to include a plurality of unit delays.

4. The apparatus for testing setup/hold time of claim 2, wherein the off-chip driver calibration unit includes:
   a first latch circuit unit configured to latch the pre-fetched data to output latched data;
   a first decoder configured to decode the latched data to output off-chip driver calibration signals;
   a second decoder configured to decode the latched data to output the selection signals; and
   a third decoder configured to decode the latched data to output the setup/hold calibration signals.

5. The apparatus for testing setup/hold time of claim 3, wherein, among the plurality of unit delays, the number of unit delays through which the output signal of the input buffer pass is changed according to the setup/hold calibration signals.

6. The apparatus for testing setup/hold time of claim 5, wherein the setup/hold calibration signals include a plurality of signal bits.

7. The apparatus for testing setup/hold time of claim 5, wherein the setup/hold calibration control unit is configured to perform logical AND operations on the selection signal and the plurality of signal bits to output operation results, respectively.

8. The apparatus for testing setup/hold time of claim 1, wherein, the off-chip driver calibration unit configured to generate the selection signals and the setup/hold calibration signals using the input data, when the test mode signal is in an enabled state.

9. A method for testing setup/hold time, comprising:
   selecting a data input unit among a plurality of data input units; and
   calibrating setup/hold time of the selected data input unit according to input data when a test mode is in an enabled state.

10. The method for testing setup/hold time of claim 9, further comprising:
   storing input data inputted while the test mode is in a disabled state.

11. The method for testing setup/hold time of claim 10, wherein the input data inputted while the test mode is in a disabled state is data in which selection information for specifying which of the plurality of data input units to be selected among the plurality of data input units and setup/hold calibration information for specifying setup/hold time calibration amount of a selected data input unit are encoded.

12. The method for testing setup/hold time of claim 11, wherein the setup/hold time calibration is configured to be obtained by one of increasing and decreasing a data delay time of a data input unit, which is selected according to the selection information, according to the setup/hold time calibration information.

13. A method for testing setup/hold time, comprising:
   decoding data input to input terminals of an off-chip driver calibration unit through a first signal path to output a first decoded signal when a test mode signal is in a disabled state; and
   generating off-chip driver calibration signals according to the first decoded signal,
   wherein the off-chip driver calibration unit decodes data input to the input terminal through a second signal path to output a second decoded signal when the test mode signal is in an enabled state, and calibrates setup/hold time of a data input unit selected among the plurality of data input units according to the second decoded signal.

14. The method for testing setup/hold time of claim 13, wherein the decoding and generating includes storing data input to the input terminals when the test mode signal is in a disabled state.

15. The method for testing setup/hold time of claim 14, wherein data input to the input terminals are configured to be data pre-fetched in one of the plurality of data input units.

16. The method for testing setup/hold time of claim 14, wherein when the test mode is in an enabled state, data input to the input terminals are configured to be data in which selection information for specifying data input units to be selected among the plurality of data input units and setup/hold calibration information for specifying setup/hold time calibration amount of a selected data input unit are encoded.

17. The method for testing setup/hold time of claim 16, wherein the setup/hold time calibration is obtained by one of increasing and decreasing a data delay time of a data input unit, which is selected according to the selection information, according to the setup/hold time calibration information.

18. An apparatus for testing setup/hold time, comprising:
   an input buffer configured to receive input data;
   a setup/hold calibration unit configured to calibrate setup/hold time of the input data by delaying an output signal of the input buffer by as much as a delay time corresponding to the setup/hold calibration signals enabled according to selection signals;
   a pre-fetch circuit unit configured to pre-fetch an output signal of the setup/hold calibration unit to output pre-fetched data;
   a first latch circuit unit configured to latch the pre-fetched data; and
   a plurality of decoders, each configured to decode the latched pre-fetched data to output off-chip driver calibration signals, the selection signals, and the setup/hold calibration signals.

19. The apparatus for testing setup/hold time of claim 18, wherein the setup/hold calibration unit includes a plurality of unit delays, and a number of the plurality of unit delays through which the output signal of the input buffer passes changes according to the setup/hold calibration signals.

20. The apparatus for testing setup/hold time of claim 18, wherein the setup/hold calibration control unit performs logical AND operations on the selection signal and a plurality of signal bits of the setup/hold calibration signals to output operational results.

21. A semiconductor memory apparatus, comprising:
a plurality of data input units, each configured to be selected in response to respective selection signals, wherein a selected input unit is configured to calibrate setup/hold time of input data in response to setup/hold calibration signals; and
an off-chip driver calibration unit configured to generate the selection signals and the setup/hold calibration signals using the input data input of one of the plurality of data input units,
wherein memory data is written into memory regions according to the setup/hold time of the input data.

22. The semiconductor memory apparatus of claim 21, wherein the off-chip driver calibration unit includes:
a latch circuit unit latching the pre-fetched data to output latched data; and
a plurality of decoders, each configured to decode the latched data to output one of the selection signals and the setup/hold calibration signals.

* * * * *